(12) United States Patent
Murakami et al.

(10) Patent No.: US 6,802,099 B2
(45) Date of Patent: Oct. 12, 2004

(54) CLEANING MEMBER AND CYLINDRICAL CLEANING ELEMENT

(75) Inventors: Seigo Murakami, Kanagawa (JP); Hiroshi Ishii, Kanagawa (JP); Norio Yamada, Kanagawa (JP); Hidetoshi Nose, Kanagawa (JP); Fujio Aoyama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 301 days.

(21) Appl. No.: 09/964,661

(22) Filed: Sep. 28, 2001

(65) Prior Publication Data

US 2002/0046434 A1 Apr. 25, 2002

(51) Int. Cl.$^7$ .......................... B08B 11/00; B08B 13/00
(52) U.S. Cl. .............................. 15/102; 15/77; 15/244.1
(58) Field of Search ............................ 15/77, 102, 230, 15/244.1

(56) References Cited

U.S. PATENT DOCUMENTS

| 3,725,969 | A | * | 4/1973 | Horeni |
| 4,566,911 | A | * | 1/1986 | Tomita et al. |
| 4,705,711 | A | * | 11/1987 | Perna |
| 5,311,634 | A | * | 5/1994 | Andros |
| 6,080,092 | A | * | 6/2000 | Cercone et al. |
| 6,502,273 | B1 | * | 1/2003 | Mihara et al. |

* cited by examiner

Primary Examiner—Randall Chin
(74) Attorney, Agent, or Firm—Wenderoth, Lind & Ponack, L.L.P.

(57) ABSTRACT

A rotary shaft having a predetermined diameter and a cylindrical cleaning element having an axial through-hole formed therein and capable of being either in a wet or a dry state are prepared. The through-hole has, in a wet state, a predetermined diameter smaller than that of the rotary shaft. The cleaning element is wetted and the through-hole of the wet cleaning element enlarged so that it has a diameter larger than that of the rotary shaft. The enlarged cleaning element is dry-set and the rotary shaft is inserted into the through-hole of the cleaning element. The cleaning element is then wetted, to contract the diameter of the through-hole of the cleaning element and provide a press-fit between the cleaning element and the shaft. A, cleaning member comprising a cylindrical cleaning element and a rotary shaft held therein with a press-fit is obtained.

5 Claims, 4 Drawing Sheets

CLEANING MEMBER AND CYLINDRICAL CLEANING ELEMENT

BACKGROUND OF THE INVENTION

The present invention relates to a cleaning member which is used in, for example, a scrub cleaning process for semiconductor wafers.

FIG. 4 shows a scrub cleaning apparatus for cleaning a surface of a semiconductor wafer W. This cleaning apparatus comprises spin chucks 40 for holding a semiconductor wafer W as an object to be cleaned and subjecting it to rotation, and a cleaning liquid nozzle 43 for supplying a cleaning liquid to a wafer surface to be cleaned. A cylindrical cleaning member 46 is disposed in parallel to the wafer surface by means of a supporting drive member 44. The cylindrical cleaning member 46 is rotated about its axis while the wafer W is rotated, thereby effecting cleaning by scrubbing the wafer surface. During cleaning, the cleaning liquid is supplied from the nozzle 43.

As shown in FIG. 5, the cleaning member 46 comprises a rotary shaft 51 and a cylindrical cleaning element 52 made of sponge and surrounding the rotary shaft 51. Conventionally, in assembling these elements, a lubricant is coated on an inner circumferential surface of the cylindrical cleaning element 52, and the rotary shaft 51, which has a larger diameter than the inner circumferential surface of the cylindrical cleaning element 52, is inserted from one end of the cylindrical cleaning element 52. However, in the cleaning member assembled in the abovementioned manner, the cylindrical cleaning element 52, which is made of sponge, is likely to be subject to undesirable deformation, and in some cases ruptures.

SUMMARY OF THE INVENTION

An object of the present invention is to obviate the above-mentioned disadvantage of the conventional cleaning member.

That is, the present invention provides a cleaning member comprising a cylindrical cleaning element having an axial through-hole formed therein and a rotary shaft held in the through-hole with a press-fit. The cylindrical cleaning element is capable of being in either a wet state or a dry state. When the cylindrical cleaning element is separated from the rotary shaft, the through-hole of the cylindrical cleaning element in a wet state has a diameter smaller than a shaft diameter of the rotary shaft and is capable of being enlarged. The cylindrical cleaning element in a dry state is capable of being set in a form such that the through-hole is enlarged. The press-fit of the rotary shaft in the through-hole of the cylindrical cleaning element is performed when the cylindrical cleaning element is in a wet state.

This cleaning member is produced by a method comprising preparing the above-mentioned rotary shaft and cylindrical cleaning element, wetting the cylindrical cleaning element, enlarging the through-hole of the wet cylindrical cleaning element so that it has a diameter larger than the diameter of the rotary shaft, dry-setting the enlarged cylindrical cleaning element, inserting the rotary shaft into the through-hole of the dry-set cylindrical cleaning element, and wetting the cylindrical cleaning element into which the rotary shaft has been inserted to thereby contract the diameter of the through-hole of the cylindrical cleaning element and provide a press-fit between the cylindrical cleaning element and the rotary shaft.

In this method, in order to enlarge the diameter of the cylindrical cleaning element, use is made of a tool for enlarging a diameter of a cylindrical cleaning element. The tool comprises a cylindrical segmented core rod having an axial through-hole formed therein and capable of being diametrically enlarged or contracted. The segmented core rod in a contracted state has a diameter smaller than a predetermined diameter of the cylindrical cleaning element in a wet state A diameter-enlarging element is adapted to be inserted into the through-hole of the segmented core rod so as to enlarge a diameter of the segmented core rod to a diameter larger than the outer diameter of the rotary shaft.

Hereinbelow, the present invention is described, based on embodiments shown in the accompanying drawings.

DETAILED DESCRIPTION OF PREFERRED EMBODIMENT

Figure 1:
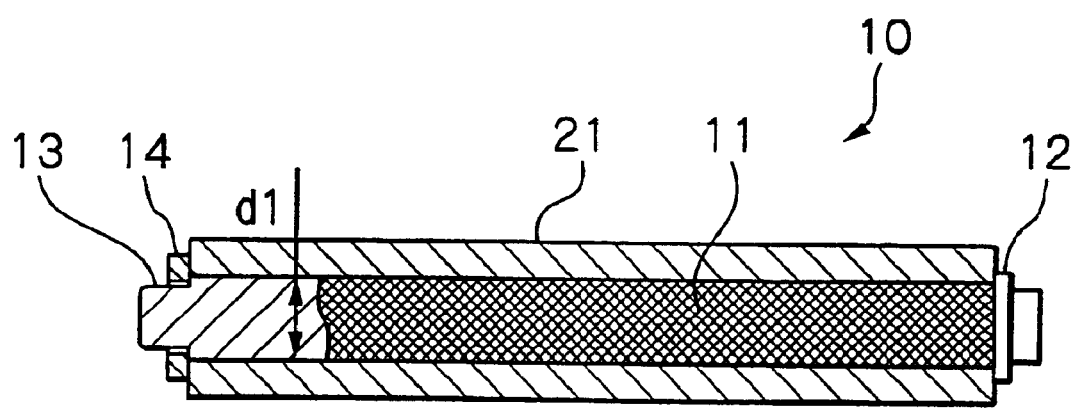
FIG. 1(a) is a cross-sectional view of a cleaning member according to an embodiment of the present invention, which comprises a cylindrical cleaning element and a rotary shaft inserted into a through-hole formed in the cylindrical cleaning element.
FIG. 1(b) is a cross-sectional view of the cylindrical cleaning element before being attached to the rotary shaft, wherein a left-side-portion indicates the cylindrical cleaning element in a wet state; and a right-side portion indicates the cylindrical cleaning element in a dry state.
Figure 1:
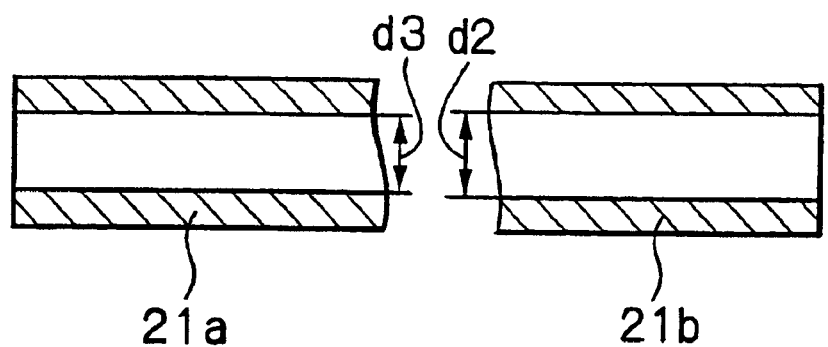

FIG. 1(a) is a cleaning member according to an embodiment of the present invention which is used in a scrub cleaning apparatus. As shown in FIG. 1(a), a cleaning member 10 comprises a cylindrical cleaning element 21 made of sponge and having an axial through-hole formed therein and a rotary shaft 11 having a circular cross-section and held in the through-hole of the cylindrical cleaning element 21 with a press-fit. Opposite ends of the rotary shaft 11 protrude from the cylindrical cleaning element 21. One [on a right side in FIG. 1(a)] of the opposite ends of the rotary shaft 11 is formed with a flange 12 so that one end of the cylindrical cleaning element 21 abuts against the flange 12. In this embodiment, the flange 12 has a smaller outer diameter than the cylindrical cleaning element 21. The other end 13 [on a left side in FIG. 1(a)] of the rotary shaft 11 includes a threaded portion. This threaded portion is connected with a nut 14 so that an end face of the nut 14 abuts against the other end 13 of the cylindrical cleaning element 21.

An outer circumferential surface of the rotary shaft 11 is knurled or provided with a plurality of narrow, axial grooves arranged in spaced relation in a circumferential direction, so as to prevent a relative sliding motion between the rotary shaft 11 and the cylindrical cleaning element 21. A cleaning liquid supply opening can be formed in the outer circumferential surface of the rotary shaft 11 so as to enable a cleaning liquid to be supplied from an inside of the rotary shaft 11 to the cylindrical cleaning element 21.

FIG. 1(b) shows the cylindrical cleaning element 21 which is not attached to the rotary shaft 11. A cylindrical cleaning element 21a which is wet with water is shown on a left side in FIG. 1(b), and a cylindrical cleaning element 21b in a dry state is shown on a right side in FIG. 1(b). The cylindrical cleaning element 21a in a wet state has an inner diameter d3 which is smaller than a diameter d1 of the rotary shaft 11. The cylindrical cleaning element 21b in a dry state has an inner diameter d2 which is larger than the diameter d1.

The cylindrical cleaning element 21 is made of a material which is reversible between a wet state and a dry state. That is, the cylindrical cleaning element 21 is made of a material having properties such that when it is wet with water, it can be deformed into a desired form with a high degree of freedom and, when it is subjected to drying while being maintained in such a desired form, it is set substantially in that form. Further, the material should have properties such that when it is dry-set in a desired form and is caused to be wet again, it is substantially restored to its original form. In this embodiment, it is preferred to use PVAt (polyvinyl acetal) produced by condensation of PVA (polyvinyl alcohol) with aldehyde, especially PVF (polyvinyl formal), as a material for the cylindrical cleaning element 21. This material is excellent in hydrophilicity, exhibits good water-absorbing and retaining properties due to fine interconnecting pores formed therein, and has the above-mentioned reversible nature. Further, during cleaning, it does not damage an object being cleaned and follows irregularities in a surface of the object. In addition, there is no variation in water absorbency.

Figure 2:
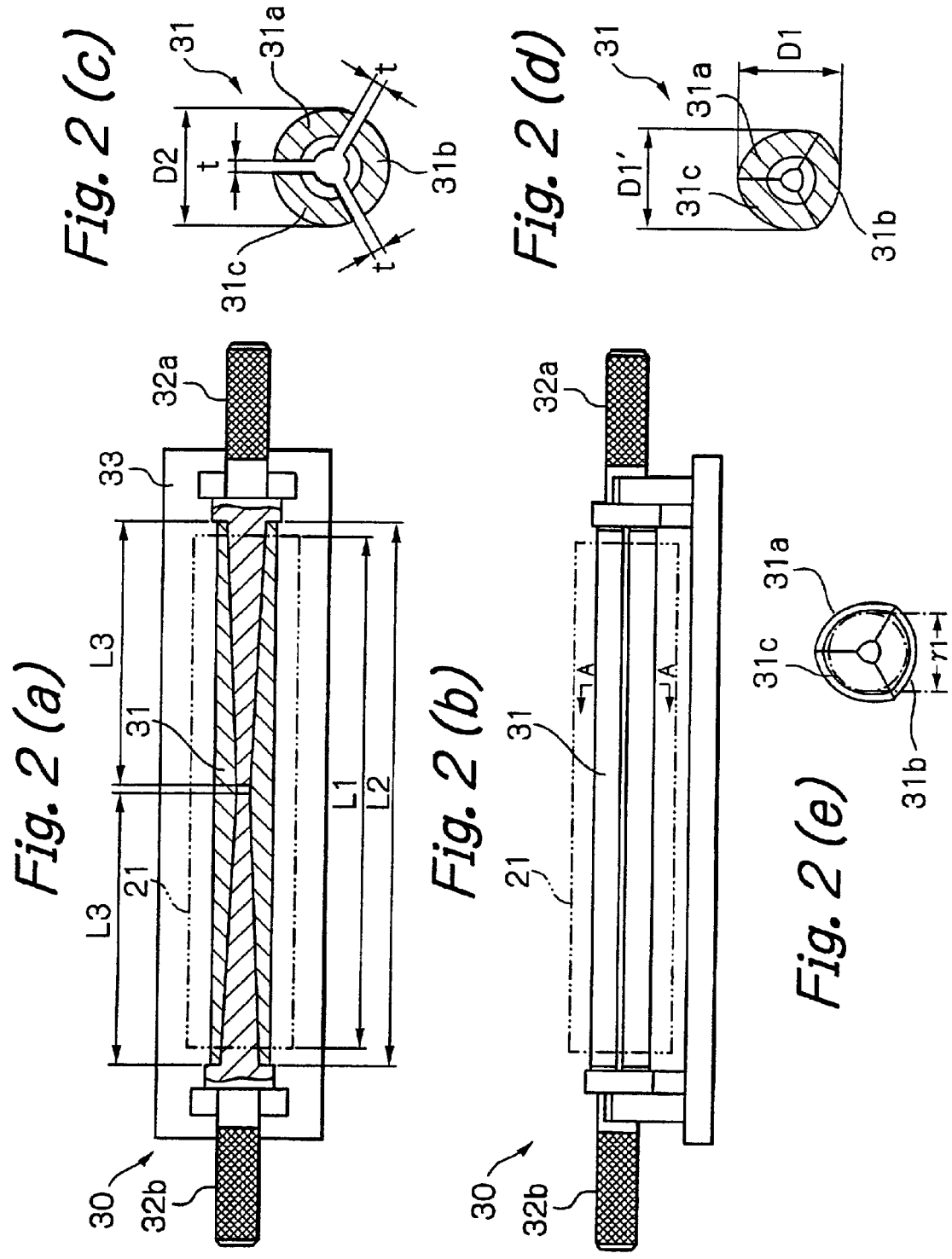
FIG. 2(a) is a plan view, partially in section, of a tool for enlarging a diameter of the cylindrical cleaning element in a wet state shown in FIG. 1.
FIG. 2(b) is a front view of the tool for enlarging the diameter of the cylindrical cleaning element.
FIG. 2(c) is a cross-sectional view, taken along the line A—A in FIG. 2(b).
FIG. 2(d) is a cross-sectional view corresponding to FIG. 2(c), wherein the tool for enlarging the diameter of the cylindrical cleaning element is in a diametrically contracted state.
FIG. 2(e) is an end view of the tool for enlarging the diameter of the cylindrical cleaning element in a diametrically contracted state.

FIG. 2(a) is a plan cross-sectional view of a tool 30 for forming a cylindrical cleaning element, which is placed on a base mount 33. FIG. 2(b) is a front view of the tool 30. Two-dot-chain lines indicate the cylindrical cleaning element 21.

The cylindrical cleaning element forming tool 30 comprises a segmented core rod 31 in a cylindrical form and two diameter-enlarging elements 32a and 32b to be inserted into the segmented core rod 31. As is indicated in FIG. 2(c) which is an enlarged cross-sectional view, taken along the line A—A, the segmented core rod 31 is in a form obtained by dividing a cylindrical core rod into a plurality of segments arranged in a circumferential direction thereof. In this embodiment, the segmented core rod 31 comprises three segments 31a, 31b and 31c. The number of segments is two or more, preferably three or four, most preferably three.

FIG. 2(d) shows a cross-section of the segmented core rod 31 in a diametrically contracted state in which the segments thereof make intimate contact with each other so that gaps t between the segments become zero [which cross-section is taken at the same position as FIG. 2(c)]. The cross-section shown in FIG. 2(d) does not form a true circle, but rather a quasi triangle. A maximum value and a minimum value of a diametrical width of an outer periphery of the cross-section are designated by D1 and D1', respectively. The value D1 is made substantially equal to or smaller than the inner diameter d3 of the cylindrical cleaning element 21 in a wet state. If the value D1 is equal to or slightly larger than the inner diameter d3, the cylindrical cleaning element 21 can be subject to elastic deformation, and it is not difficult to insert the segmented core rod into the cylindrical cleaning element 21. If the value D1 of the segmented core rod 31 is larger than the inner diameter d3 of the cylindrical cleaning element by about 10%, the segmented core rod 31 can be relatively easily inserted into the cylindrical cleaning element 21.

The diameter-enlarging elements 32a and 32b can be inserted from opposite ends of the segmented core rod 31. Each diameter-enlarging element is in a conical (taper) form which is tapered toward a distal end, or an inner end, thereof. An inner circumferential surface of the segmented core rod 31 is imparted with a form conforming to the taper surfaces of the diameter-enlarging elements 32a and 32b when they are inserted into the segmented core rod 31.

The diameter of the inner end (or the distal end) of each of the diameter-enlarging elements 32a and 32b is smaller than a diameter r1 of an inscribed circle of the inner surface of an end portion of the segmented core rod 31 when the segments 31a, 31b and 31c make intimate contact with each other. Further, a diameter of a root portion of the taper is set to be a value such that when the diameter-enlarging elements 32a and 32b are inserted into the segmented core rod 31, an outer diameter D2 of the segmented core rod 31 is larger than the outer diameter d1 of the rotary shaft 11.

An entire length L2 of the segmented core rod 31 is equal to or larger than an entire length L1 of the cylindrical cleaning element 21 (L1≦L2). A length L3 between the distal end (or the inner end) and a base end (or the root portion) of each of the diameter-enlarging elements 32a and 32b is set to be equal to or smaller than a half the length L2 (L3≦L2/2). The base end of each of the diameter-enlarging elements 32a and 32b is formed with a flange. When the diameter-enlarging elements 32a and 32b are inserted up to their root portions into the segmented core rod 31, the flanges abut against opposite end faces of the segmented core rod 31. Thus, when the diameter-enlarging elements 32a and 32b are inserted into the segmented core rod 31, the flanges abut against the end faces of the segmented core rod 31 and an outer diameter of the segmented core rod) 31 automatically becomes the diameter D2.

Preferably, a material for the diameter-enlarging elements 32a and 32b is the same as a material for the rotary shaft 11. A typical example of such a material is PVC (polyvinyl chloride). By this arrangement, it is possible to prevent the cylindrical cleaning element 21 from being contaminated with, for example, a metal ion during production thereof.

According to one embodiment of the present invention, the dimensions of each element are as follows. With respect to the cylindrical cleaning element 21, when it was in a wet state without being attached to the rotary shaft 11, the entire length L1 was 208 mm with a tolerance of 0 to +2 mm; the inner diameter d3 18 mm; and an outer diameter 31 mm [Although not shown, a number of protrusions radially extending about 3.5 mm and having a diameter in is cross-section of about 5 mm may be formed in spaced relation in an outer circumferential surface of the cylindrical cleaning element 21. In this case, the outer diameter of the cylindrical cleaning element 21 (the diameter of a circle in contact with distal ends of the protrusions) is 38 mm]. When the cylindrical cleaning element 21 was wet and attached to the rotary shaft 11, the entire length L1 was 209 mm and the outer diameter was 38 mm with a tolerance of 0 to +2 mm. With respect to the rotary shaft 11, the outer diameter d1 was 21 mm. Therefore, interference of the cylindrical cleaning element 21 relative to the rotary shaft was determined from the formula d1/d3=21/18=1.17. That is, the interference was 17%. With respect to the segmented core rod, the outer diameter D2 was 21.5 mm; D1 19.72 mm; and D1' 19.47 mm. Therefore, a ratio of enlargement of the inner diameter of the cylindrical cleaning element 21 was determined from the formula D2/d3=21.5/18=1.19. That is, the ratio of enlargement was 19%.

Next, description is made with regard to a method for producing the cylindrical cleaning element 21b [FIG. 1(b)] in a dry state using the cylindrical cleaning element forming tool 30 arranged as described above.

First, a cylindrical cleaning element 21 having an inner diameter of d3 in a wet state is prepared. The segmented core rod 31 (31a, 31b, 31c) in a diametrically contracted state is inserted into the cylindrical cleaning element 21. The diametrical widths D1 and D1' of the outer periphery of the segmented core rod 31 are larger than the inner diameter d3 of the cylindrical cleaning element 21 in a wet state by about 10%. However, the segmented core rod 31 can be easily inserted into a hollow of the cylindrical cleaning element 21.

Subsequently, the two diameter-enlarging elements 32a and 32b are inserted from the opposite ends of the segmented core rod 31 at the same time until the flanges of the diameter-enlarging elements abut against the end faces of the segmented core rod 31. Since the two elements are inserted at the same time, the segmented core rod 31 is uniformly enlarged, and its outer diameter becomes D2. The cylindrical cleaning element 21 in a wet state is elastically deformable, so that its inner diameter is increased to D2 and maintained in that state.

The cylindrical cleaning element 21 having its inner diameter being enlarged is placed, together with the base mount 33, in an electric furnace which is maintained at about 50° C. The cylindrical cleaning element 21 is retained in the furnace for 20 hours or more (23 hours in one embodiment). However, the time of retention in the electric furnace may be increased or decreased from the above-mentioned value, depending on the temperature of the electric furnace. For example, when the temperature of the electric furnace is lower than 50° C., the time of retention is required to be substantially longer than 20 hours. When the temperature of the electric furnace is, for example, 55° C., the time of retention can be made shorter than 20 hours. Thus, the time of retention can be reduced by increasing the temperature of the electric furnace, but it can be also reduced by discharging air from the electric furnace (to create a vacuum) or charging high-purity nitrogen into the furnace for dehumidification.

After the cylindrical cleaning element 21 has been dried sufficiently in the electric furnace, the cylindrical cleaning element 21 is taken out from the furnace and the diameter-enlarging elements 32a and 32b are removed from the segmented core rod 31. Consequently, the diametrical widths of the outer periphery of the segmented core rod 31 become D1 and D1'. Therefore, the segmented core rod 31 can be easily removed from the cylindrical cleaning element 21b. The thus produced dry cylindrical cleaning element 21b is rigid, so that it is easy to handle.

The thus produced cylindrical cleaning element 21b has an inner diameter of d2 which is substantially equal to the diameter D2, and can be loosely fitted onto the rotary shaft 11. After fitting, when the cylindrical cleaning element 21 is caused to be wet, it is restored to its original contracted form. Thus, an assembly (the cleaning member 10) comprising the rotary shaft 11 and the cylindrical cleaning element 21 shown in FIG. 1(a) is obtained. The cleaning member 10 is attached to the supporting drive member 44 in a cleaning apparatus such as that shown in FIG. 4, and used for cleaning a semiconductor wafer W.

The cylindrical cleaning element 21b in a dry state is rigid, but has elasticity to some extent. Therefore, the inner diameter d2 can be measured as being larger or smaller than an actual value, depending on the method for measurement. "The inner diameter d2 of the cylindrical cleaning element 21b is larger than the outer diameter d1 of the rotary shaft 11" means a state such that the dry-set cylindrical cleaning element 21b can be fitted onto the rotary shaft 11 in a non-forcible manner, which includes a state in which the diameters d2 and d1 are substantially equal to each other.

Figure 3:
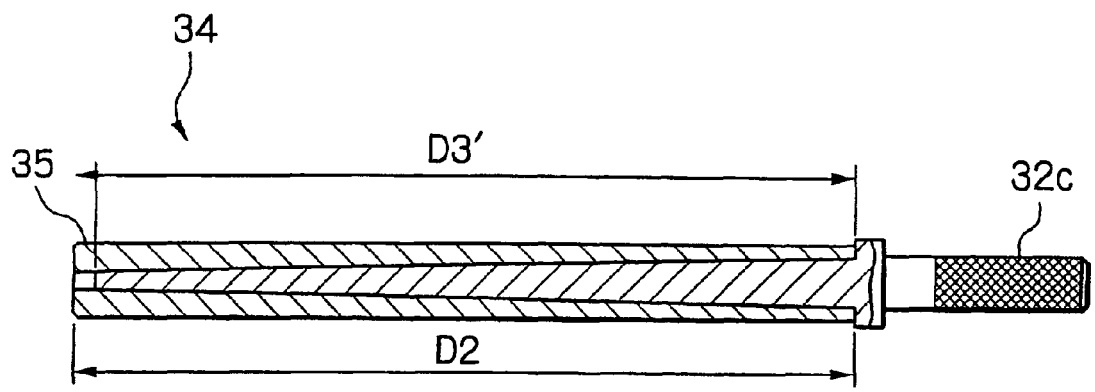
FIG. 3 is a cross-sectional view of a tool for enlarging a diameter of a cylindrical cleaning element according to another embodiment of the present invention.

FIG. 3 shows a tool 34 for forming a cylindrical cleaning element according to another embodiment of the present invention. In the cylindrical cleaning element forming tool 34, an entire length of a segmented core rod 35 comprising two or more segments is L2 as in the case of the segmented core rod of the cylindrical cleaning element forming tool 30. However, an inner circumferential surface of the segmented core rod 35 is uniformly tapered through the entire length of the segmented core rod 35 from one end toward the other end thereof. A diameter-enlarging element 32c has a length L3 which is slightly smaller than the length L2 of the segmented core rod 35, and is tapered in conformity to the segmented core rod 35. In this embodiment, in substantially the same manner as in the case of FIG. 2, by inserting the diameter-enlarging element 32c into the segmented core rod 35, the inner diameter of the cylindrical cleaning element in a wet state is enlarged, to thereby produce the dry cylindrical cleaning element 21b.

Preferably, the dry cylindrical cleaning element 21b is produced in a clean room.

Before the cylindrical cleaning element 21 is dried, if desired, purifying (cleaning) processes ① to ② mentioned below may be conducted with respect to the cylindrical cleaning element 21 in a wet state. ① The cylindrical cleaning element 21 is cleaned by repeatedly pressing the cylindrical cleaning element 21 while feeding super-high-purity water to the cylindrical cleaning element 21. ② The cylindrical cleaning element 21 is immersed in a cleaning liquid and subjected to ultrasonic cleaning, which cleaning liquid does not cause deterioration of the cylindrical cleaning element 21 and is obtained by diluting a surfactant (such as NCW601A manufactured and sold by Wako Pure Chemical Industries, Ltd.) or a weak acid or weak alkali electronic industry cleaning liquid with super-high-purity water. ③ The cylindrical cleaning element 21 is rinsed by repeatedly pressing the cylindrical cleaning element 21 while feeding super-high-purity water to the cylindrical cleaning element 21. With respect to the tool for forming the cylindrical cleaning element, it should be noted that before the tool for forming the cylindrical cleaning element is attached to the cylindrical cleaning element and used for drying, the tool is cleaned with super-high-purity water or a cleaning liquid in the same manner as described in items ① to ③ above, although pressing of the tool is unnecessary.

Figure 4:
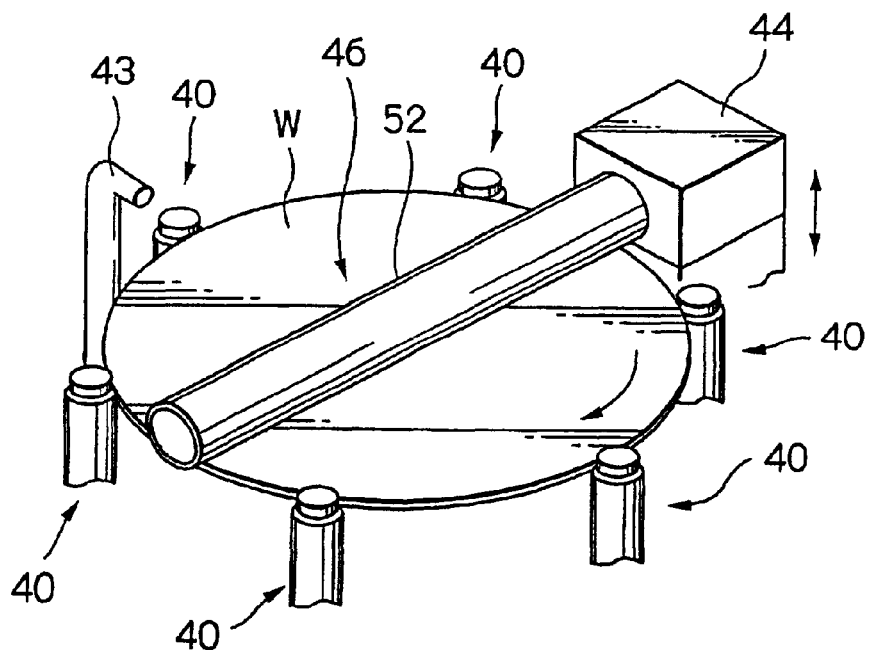
FIG. 4 is a perspective view of a scrub cleaning apparatus for cleaning a wafer to which the cleaning member of the present invention is attached.
Figure 5:
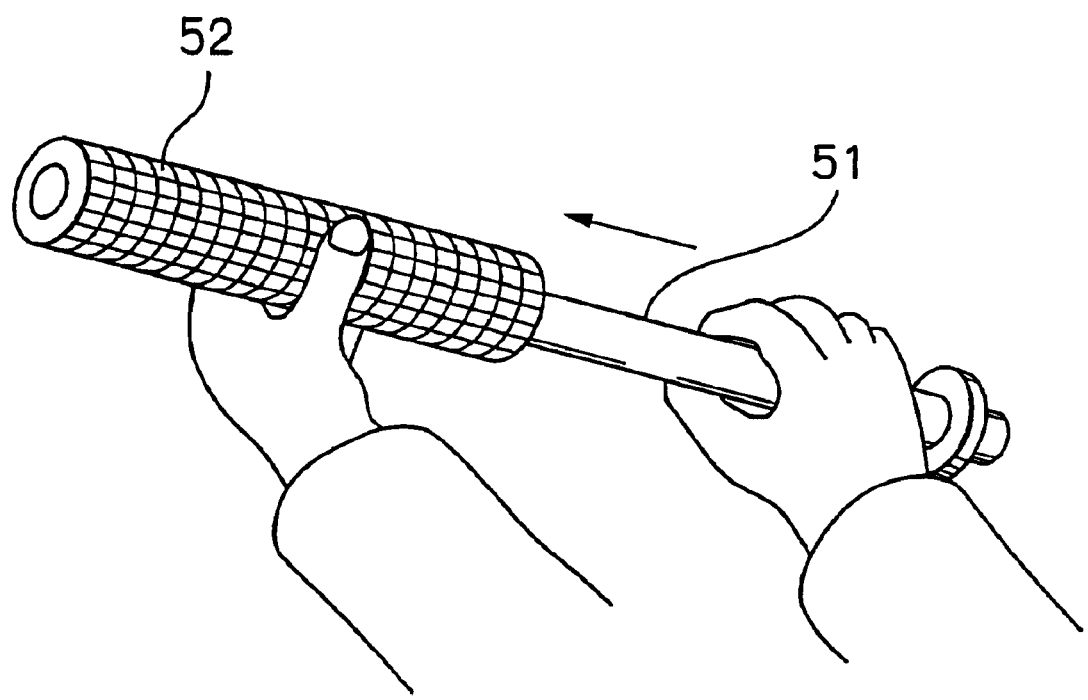
FIG. 5 shows how a cylindrical cleaning element is assembled to a rotary shaft.

In a clean room, the cylindrical cleaning element 21b after purifying, enlarging and dry-setting in the above-mentioned manner may be vacuum-packaged in a powder-free polyethylene bag which generates no dust or clean-packaged in a powder-free polyethylene bag charged with high-purity nitrogen containing no dust. The cylindrical cleaning element 21b may be double-packaged by enclosing the vacuum package or the clean package in a powder-free polyethylene bag. In this arrangement, the dry cylindrical cleaning element delivered from the clean room is separated from an outermost package just before being brought into a clean room for producing semiconductors, in which a cleaning apparatus such as that shown in FIG. 4 is provided, and the vacuum package or the clean package is removed just before the cylindrical cleaning element is attached to the cleaning apparatus. Thus, the cylindrical cleaning element 21b produced under clean conditions in the clean room is fitted onto the rotary shaft 11 to assemble the cleaning member 10 without being contaminated due to exposure to outside air. Super-high-purity water is fed from the cleaning liquid nozzle 43 to the cleaning member 10 attached to the cleaning apparatus to thereby return the cylindrical cleaning element 21 to a wet state. A clean semiconductor wafer is loaded on the cleaning apparatus and an operation of the cleaning apparatus is started. In order to increase a cleaning ability of the cylindrical cleaning element 21 in a wet state to a sufficient level, an initializing cleaning operation may be conducted. When the cylindrical cleaning element 21 is preliminarily purified in a wet state before drying, and then clean-packaged, the cylindrical cleaning element 21 is extremely clean and the initializing cleaning operation can be conducted for a short period of time.

The ratio of enlargement of the cylindrical cleaning element 21, that is, D2/d3 (≈d1/d3) is set to be 15 to 40%. When the ratio of enlargement is too low, the interference between the cylindrical cleaning element 21 and the rotary shaft 11 is insufficient. When the ratio of enlargement is too high, the cylindrical cleaning element 21 is likely to be damaged. The ratio of enlargement is more preferably 19 to 25%. It is 23% in one embodiment.

Conventionally, the cylindrical cleaning element is fitted onto the rotary shaft by forcefully enlarging the cylindrical cleaning element in a wet state. Therefore, when the ratio of enlargement is, for example, 20% or more, the cylindrical cleaning element is liable to rupture. However, when the cylindrical cleaning element is produced by the cylindrical cleaning element forming tool of the present invention, the cylindrical cleaning element is uniformly enlarged in a non-forcible manner, without imparting damage to cylindrical cleaning element.

The cylindrical cleaning element 21 provides a press-fit on the rotary shaft 11. During cleaning, a relative sliding motion between the rotary shaft 11 and the cylindrical cleaning element 21 due to a rotation moment acting on the cylindrical cleaning element 21, which is caused by friction between the cylindrical cleaning element 21 and the substrate W, can be prevented. Further, in order to prevent a sliding motion between the rotary shaft 11 and the cylindrical cleaning element 21 during cleaning, the rotary shaft 11 is knurled so as to form narrow grooves in a surface thereof, so that the sliding motion is suppressed more effectively. By using the cylindrical cleaning element 21b described above, the cylindrical cleaning element can be easily attached to the rotary shaft 11 on which knurls are formed. Further, by using the cylindrical, cleaning element 21b, interference between the cylindrical cleaning element and the knurled rotary shaft can be sufficiently obtained, so that a sliding motion between the cylindrical cleaning element 21 and the rotary shaft 11 during cleaning can be suppressed and, therefore, twisting of the cylindrical cleaning element 21 can be minimized.

In conventional techniques, it is difficult to exchange only cylindrical cleaning elements in a place for operation for semiconductor manufacturing processes, in which a semiconductor wafer cleaning apparatus such as that shown in FIG. 4 is provided in a clean room. Therefore, when the cylindrical cleaning element is worn, it is detached, together with the rotary shaft, from the cleaning apparatus and a new cylindrical cleaning element attached to a rotary shaft, which has been preliminary stored for replacement, is attached to the cleaning apparatus. Therefore, when the cylindrical cleaning element is discarded, the rotary shaft attached thereto is also discarded. This problem is solved by the present invention in which the cylindrical cleaning element is easily attached to the rotary shaft.

Various embodiments of the present invention have been described above. However, the present invention is not limited to the above-mentioned embodiments. Various modifications are possible within the scope of the present invention.

What is claimed is:

1. A cleaning member comprising:
 a cylindrical cleaning element having an axial through-hole formed therein; and
 a rotary shaft held in said through-hole with a press-fit, said rotary shaft having an outer shaft diameter;
 wherein said cylindrical cleaning element is capable of being in either a wet state or a dry state;
 wherein said cylindrical cleaning element has a structure such that, when said cylindrical cleaning element is in a dry state, said through-hole has a diameter larger than the outer diameter of the rotary shaft, and when said cylindrical cleaning element is in a wet state and not on said rotary shaft, said through-hole has a diameter smaller than the outer shaft diameter of said rotary shaft, such that when said cylindrical cleaning element is in a wet state and on said rotary shaft, the rotary shaft is held in said through-hole with the press-fit.

2. The cleaning member of claim 1, wherein each of said rotary shaft and said through-hole has a circular cross-section.

3. The cleaning member of claim 1, wherein said rotary shaft has a surface including raised and recessed portions for preventing sliding motion of said cylindrical cleaning element thereon.

4. The cleaning member of claim 1, wherein said cylindrical cleaning element is made of sponge comprising polyvinyl acetal or polyvinyl formal.

5. The cleaning member of claim 1, wherein said cylindrical cleaning element is made in the dry state, then placed in the wet state and has said through-hole enlarged, and is then the wet state.

* * * * *